(12) United States Patent
Devarajan et al.

(10) Patent No.: US 9,106,210 B2
(45) Date of Patent: Aug. 11, 2015

(54) LOW-DISTORTION PROGRAMMABLE CAPACITOR ARRAY (71) Applicant: ANALOG DEVICES, INC., Norwood, MA (US)

(72) Inventors: Siddharth Devarajan, Arlington, MA (US); Lawrence A. Singer, Wenham, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/187,440

(22) Filed: Feb. 24, 2014

(65) Prior Publication Data
US 2014/0266358 A1   Sep. 18, 2014

Related U.S. Application Data (60) Provisional application No. 61/784,295, filed on Mar. 14, 2013.

(51) Int. Cl.
*H03K 5/01* (2006.01)
*H03H 19/00* (2006.01)
(52) U.S. Cl.
CPC ............... *H03K 5/01* (2013.01); *H03H 19/006* (2013.01); *H03H 19/008* (2013.01); *H03K 2217/0018* (2013.01)
(58) Field of Classification Search
None
See application file for complete search history.

(56) References Cited

U.S. PATENT DOCUMENTS

| | | | | |
|---|---|---|---|---|
| 5,084,634 | A | * | 1/1992 | Gorecki .......................... 327/91 |
| 6,137,243 | A | * | 10/2000 | Fujimori et al. .............. 315/370 |
| 6,160,508 | A | | 12/2000 | Gustavsson et al. |
| 6,344,767 | B1 | | 2/2002 | Cheung et al. |
| 6,348,831 | B1 | | 2/2002 | Baba |
| 2011/0128062 | A1 | | 6/2011 | Greenberg et al. |

OTHER PUBLICATIONS

European Search Report in EP Application Serial No. 14157068.9 mailed Sep. 8, 2014, 8 pages.
European Office Action in EP Application Serial No. 14157068.9 mailed Nov. 13, 2014, 2 pages.
Response to European Office Action in EP Application Serial No. 14157068.9 filed Apr. 2, 2015, 19 pages.

* cited by examiner

*Primary Examiner* — Cassandra Cox
(74) *Attorney, Agent, or Firm* — Patent Capital Group (57) ABSTRACT

In one example embodiment, a programmable capacitor array is provided for low distortion and minimizing linearity degradation of an input (Vin) by utilizing control circuitry to switch on and off an array of MOSFET switches. The control circuitry turns on a MOSFET to load a capacitance on Vin and turns off the MOSFET to remove the capacitance from Vin in response to a Din control signal. When the intention is to load Vin with the capacitance, the MOSFET is left on continuously. When the intention is to remove or unload the capacitance from Vin, the MOSFET is primarily turned off, however, the MOSFET is still periodically turned on with appropriate voltage levels in response to a clock signal for periods of time when the loading of the capacitance on Vin is tolerable to the system, thereby ensuring minimal linearity degradation of Vin due to the programmable capacitor array system.

21 Claims, 5 Drawing Sheets

LOW-DISTORTION PROGRAMMABLE CAPACITOR ARRAY

PRIORITY DATA

This application claims priority to Provisional Patent Application Ser. No. 61/784,295, filed Mar. 14, 2013, which is hereby incorporated by reference in its entirety.

TECHNICAL FIELD OF THE DISCLOSURE

This present disclosure relates generally to capacitor arrays and, more particularly, to an apparatus, a method, and a system for implementing a low distortion programmable capacitor array.

BACKGROUND

A programmable capacitor array is typically configured with an array of switches each connected in series to one of an array of capacitors which in turn are connected to an input. Each switch of the array may be switched on to load a capacitor on the input of the array or switched off to remove the capacitor from the input. When the switches of a programmable capacitor array are implemented using switching devices, such as for example MOSFET transistors, the non-linearity of a switching device while in the off state may cause distortion or degradation of an input signal on the input of the array. It would provide an advantage then to have a programmable capacitor array in which the effects of the non-linearity of the switching devices on an input signal was reduced or minimized.

DETAILED DESCRIPTION OF EXAMPLE EMBODIMENTS OF THE DISCLOSURE

Overview

This present disclosure relates generally to an apparatus, a system, circuitry, and a method for a low distortion programmable capacitor array. In one example embodiment, a programmable capacitor array provides low distortion and minimizes linearity degradation of a Vin signal on the array input by utilizing control circuitry to control a MOSFET switch. The drain of the MOSFET switch is coupled to a capacitance which is coupled to the input of the array. The control circuitry turns the MOSFET on to load the capacitance on the input and off to remove the capacitance from the input in response to a Din signal. When the intention is to load the input with the capacitance, the MOSFET is left on continuously. When the intention is to remove or unload the capacitance from the input (Vin), the MOSFET is primarily turned off, however, the MOSFET is still periodically turned on briefly for a period of time when the loading of the capacitance on the input is tolerable (i.e. does not matter) to the system. This minimizes this linearity degradation of the input. Otherwise, if the MOSFET were left off continuously the linearity of the input would degrade.

In a class of circuits called 'switched capacitor circuits', such periods of time [when the loading of the capacitance on the input does not matter] are generally available. In other words, when the capacitance has been removed from the input (Vin) by the Din signal turning the MOSFET off, the control circuitry switches the MOSFET on and off in response to a clock. In the example embodiment, the clock may periodically charge the drain voltage VD of the MOSFET to the voltage VS at the source of the MOSFET. As the MOSFET is switched on and off by the clock signal, VD approaches VS. This prevents turn on of the MOSFET at high frequency Vin and minimizes linearity degradation. In an implementation of the example embodiment, the control circuitry may implemented by utilizing logic to generate a control signal at the gate input of the MOSFET. The Din signal and clock may be input to the logic. The embodiment may be configured to allow the control circuitry to periodically short the drain node of the MOSFET to its source voltage at the appropriate time by switching the MOSFET on and off. Vin as used in this disclosure means any input signal on the input of an array. In an alternative the clock may provide the switching in a non-periodic manner. Din as used in this disclosure means any input signal that may be used to control the switching of a switching device in a programmable capacitor array. Control circuitry means any circuitry or logic that is configured to receive at least one input signal, for example a Din signal, and used to provide a control signal to a switching device.

According to a further example embodiment of the disclosure, the MOSFET may be an NMOS transistor and the logic circuitry may generate the control signal at low or high logic levels to provide a voltage VG on the gate of the MOSFET in response to the first input signal and clock. The source of the MOSFET may be coupled to a voltage source at a voltage VS, and the backgate of the MOSFET may be coupled to a voltage source at a voltage VPW. The circuitry and parameters of the embodiment may be configured so that when the control signal is low and the transistor is turned off, the voltage on the gate VG is less than (VD, VS) and the voltage on the backgate VPW is less than (VD, VS). This prevents turn-on of the p-well or p-substrate diodes of the MOSFET in the programmable capacitor array of the embodiment.

According to further example embodiments of the disclosure, the low distortion programmable capacitor may be implemented in an array of multiple low distortion capacitors.

According to still further example embodiments of the disclosure, the low distortion programmable capacitor may be implemented in a differential system or in an array of multiple low distortion programmable capacitors in a differential system.

According to a still further example embodiment of the disclosure, the low distortion programmable capacitor may be implemented in a switched capacitor sample and hold system, or in an array of multiple low distortion programmable capacitors in one or multiple sample and hold systems.

According to a still further example embodiment of the disclosure, circuitry is implemented that provides low distortion by setting the drain voltage VD of a NMOS transistor of a programmable capacitor using the $DPW_1$ diode that exists between the NMOS backgate (p-well) and the NMOS drain, VD. In this embodiment a control signal is input to the backgate which sets VD and VS approximately when the NMOS transistor has been switched off by a first input signal applied to its gate.

While particular ones of the example embodiments of this disclosure may be described as including NMOS devices as the MOSFET switch, it will be realized that, with appropriate modifications to the voltages and signal parameters, PMOS devices may be used in alternative embodiments of the disclosed embodiments of the programmable capacitor array in place of the NMOS devices.

Figure 1A:
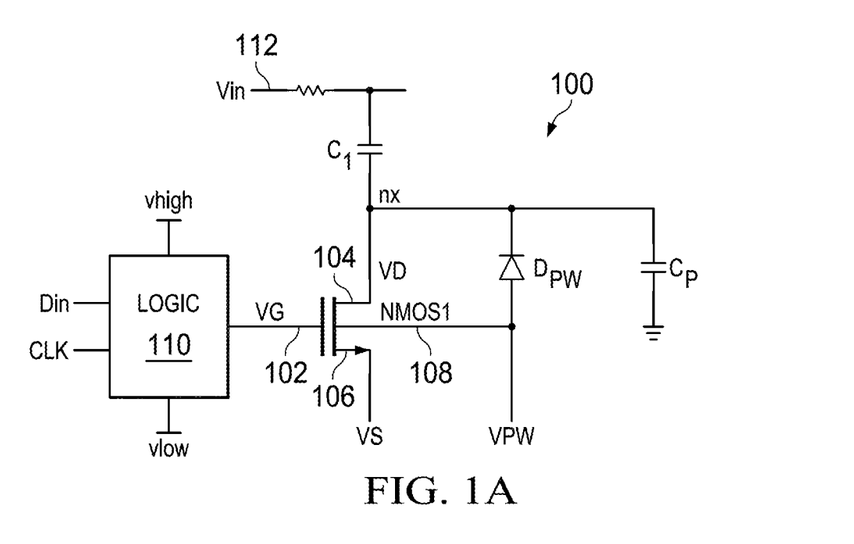
FIG. 1A illustrates circuitry for a programmable capacitor according to an example embodiment of the disclosure.

In one example embodiment of the present disclosure, a programmable capacitor array that has low distortion and minimizes linearity degradation on an input signal of the programmable capacitor is provided. Referring now to FIG. 1A, therein is illustrated a programmable capacitor 100 according to an example embodiment of the disclosure. The circuit of FIG. 1A comprises transistor NMOS1, capacitor C1 (of value C), and control circuitry comprising logic 110. The capacitor C1 couples node nx to the input 112 which receives input signal Vin. The Signal Vin may have any range of voltage values and slew rates. NMOS1 has a drain terminal 104 that may be coupled to node nx and is at voltage potential VD. NMOS1 also has a source terminal 106 that may be coupled to a node at voltage potential VS, a gate terminal 102 at a voltage potential VG that may be coupled to logic 110, and a backgate terminal 108 that may be coupled to a node at a voltage potential VPW. Logic 110 may provide a control signal at a high (vhigh) or low (vlow) logic level to provide the voltage VG at the gate of NMOS1 in response to the Din signal and clock (CLK). Diode DPW represents the p-well or p-substrate internal diode of NMOS1. Cp represents the internal parasitic capacitance of NMOS1. In the embodiment of FIG. 1A, the transistor NMOS1 may be turned on to load the input Vin with C1, or the transistor NMOS1 may be turned off to unload the input Vin with C1. The two options represent the two states of the programmable capacitor C1. When NMOS1 if on, there are no major linearity degrading effects. However, when NMOS1 is off the linearity of Vin can significantly degrade if NMOS1 is just permanently turned off in a static state. To avoid this, the transistor NMOS1 may be turned on to set the drain voltage VD to a desired state, briefly for a short period of time during which the loading of the capacitor C1 on input signal Vin does not affect the system. During this "down time" VD gets shorted to VS and hence depending on various factors like the impedance of the circuit driving VS, the resistance of NMOS1, Cp, C and the Vin network's impedance, VD approaches VS over a period of multiple clock cycles. As long as the clock rate is fast enough to supply the leakage current on VD, VD will be close to VS in value on average.

The embodiment of the disclosure prevents problems that occur in existing programmable capacitor arrays that are implemented without the features of the embodiments. For example, a programmable capacitor array may be implemented using a NMOS transistor and a capacitor configured similar to FIG. 1A but without any control circuitry such as logic 110 or other circuitry. In such a case a single signal on the gate of the NMOS transistor, such as Din, would be used to turn on the NMOS transistor to load a capacitor on the input and to turn off the NMOS transistor to remove the capacitor from the input. When the NMOS transistor is on, the programmable capacitor system, consisting of the capacitor and the NMOS transistor does not degrade the linearity of Vin signal. This is because the node nx is connected to the node on the source of the NMOS transistor and does not move with signal Vin when the NMOS transistor is on. However, when the NMOS transistor is off, an attenuated Vin signal appears at node nx, which would cause significant linearity degradation on the Vin signal due to the effect of the NMOS transistor. This may occur if the circuit driving Vin has a finite impedance such as, for example, 50 or 75 ohms. The linearity degradation arises from the fact that the NMOS transistor NMOS1 and the p-well (if the process is a triple well process) or p-substrate internal diode DPW may undesirably turn-on for certain input signals. When the NMOS transistor is off (i.e. VG is low), node nx is floating, and is only defined by leakage through DPW. Hence, nx settles close to the voltage VPW. That is, VG=VS=VPW=VD=0V when the NMOS is off. When the input signal Vin moves rapidly, nx moves along with it, which would causes nx to go below ground potential (i.e. 0V), causing both the NMOS transistor NMOS1 and DPW to turn-on, which significantly degrades the linearity of Vin. This is because the effective load capacitance becomes a non-linear function of Vin causing a non-linear high-frequency current through the capacitor C1. This problem is prevented in the example embodiments of the disclosure.

In the embodiment of FIG. 1A, when NMOS1 is turned off and the drain node voltage VD (at node nx) is floating, NMOS1 turn-on is prevented at high frequency Vin. NMOS1's DPW (p-well or p-substrate diode) turn-on is also prevented at high frequency Vin. The embodiment is configured so that turn-on is prevented over a desired range of voltage values and slew rates of Vin. For accomplishing the prevention of NMOS1 turn-on and DPW turn-on at high frequencies, the source and drain of NMOS1 while in the off-state may be nominally biased at a potential sufficiently greater than the gate of NMOS1, and the NMOS p-well (also called p-substrate or back-gate) should be reversed biased. That is, the relation VG (when low)<(VD,VS) and VPW<(VD,VS) needs to hold. To what degree VG (when low) and VPW should be lower than VD and VS depends on several factors like the maximum peak-to-peak signal swing of Vin and the ratio of C (capacitance of C1) to Cp. This may be determined by distortion simulations or calculations.

Figure 1B:
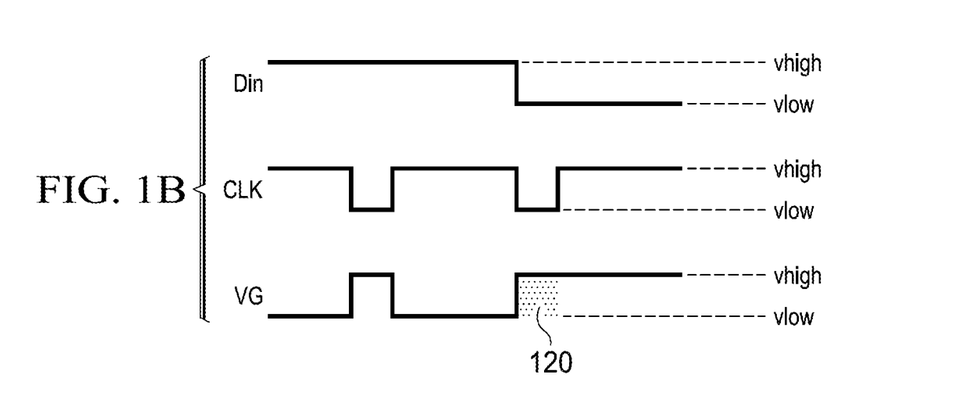
FIG. 1B illustrates example signal waveforms for the example embodiment of FIG. 1A.

Referring now to FIG. 1B, therein are illustrated example signal waveforms for the example embodiment of FIG. 1A. FIG. 1B illustrates a timing diagram of the input signals, Din and CLK, and the output control signal that provides VG on the output of the logic portion 110 of circuitry 100. FIG. 1B shows how Din and CLK may be used to generate the control signal VG. When Din is low this sets VG high and NMOS1 is turned on and loads C1 on the input of the array 100. When Din is high and CLK is high C1 is removed from the input and the capacitor is floating. The CLK signal may then be used to switch NMOS1 on and off while Din is high. According to the embodiment, a clock, generating CLK, is used to implement the periodic charging of node VD (i.e. shorting node VD to VS) during the CLK "down time". Down time is defined as when CLK is at logic level low and equal to vlow. In the embodiment, when CLK is high, and Din is high, the capacitor C1 is left floating and removed from the input by NMOS1 turning off. When Din is low, NMOS1 turns on and loads the input Vin with capacitor C1. When NMOS1 is on, there is no distortion problem since node VD is not floating and hence the behaviour of VG, as shown in FIG. 1B at 120, when CLK is low does not matter-VG could be left high, which uses less power, or VG could be toggled low.

Figure 2A:
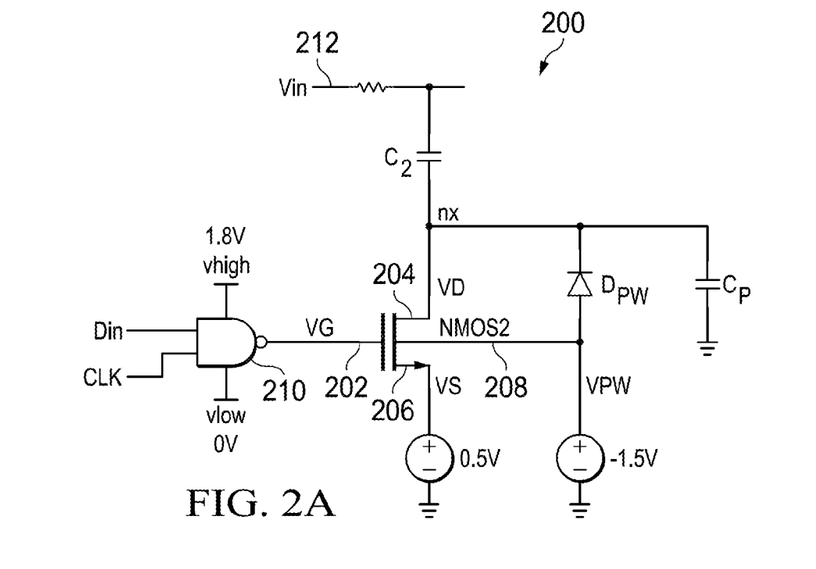
FIG. 2A illustrates a possible implementation of circuitry for a programmable capacitor according to the example embodiment of FIG. 1A.

Referring now to FIG. 2A, therein is illustrated a possible implementation of circuitry for a programmable capacitor according to the example embodiment of FIG. 1A. The embodiment of FIG. 2A is similar to FIG. 1A with the exception that reference numerals 100-112 are replace by reference numerals 200-212 for corresponding components. FIG. 2A shows the circuitry of FIG. 1A with logic 110 implemented as control circuitry using NAND gate 210 that provides the control signal to drive VG in response to the Din and clock (CLK) inputs. FIG. 2A also shows voltage sources vhigh and vlow on nand gate 210, and the voltage sources providing voltage at the potentials 0.5 volts for VS and −1.5 volts for VPW.

Figure 2B:
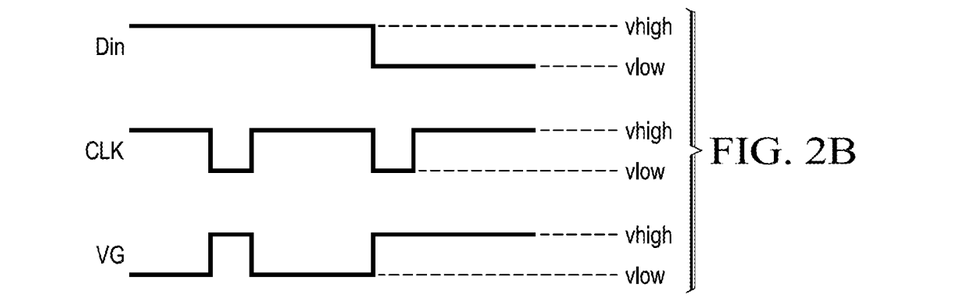
FIG. 2B illustrates example signal waveforms for the example embodiment of FIG. 2A.

Referring now to FIG. 2B, therein is illustrated example signal waveforms for the example embodiment of FIG. 2A. NAND gate 210 operates to output a control signal to provide the signal VG as shown in FIG. 2B. The operation of FIG. 2A is as was described for FIG. 1A. FIG. 2A also shows an example of some of the voltages that may be used to implement the embodiment as vhigh=1.8V, vlow=0V on NAND gate 210, and voltage sources VS=0.5V, and VPW=−1.5V. The voltage sources shown in FIG. 2A may be realized with some form of an on-chip or off-chip voltage reference, charge pumps and/or a voltage buffer, or any other type of voltage source. The implementation of FIG. 2A provides an advantage similar to that of FIG. 1A in minimizing the linearity degradation seen at the input Vin of the programmable capacitor.

Figure 3:
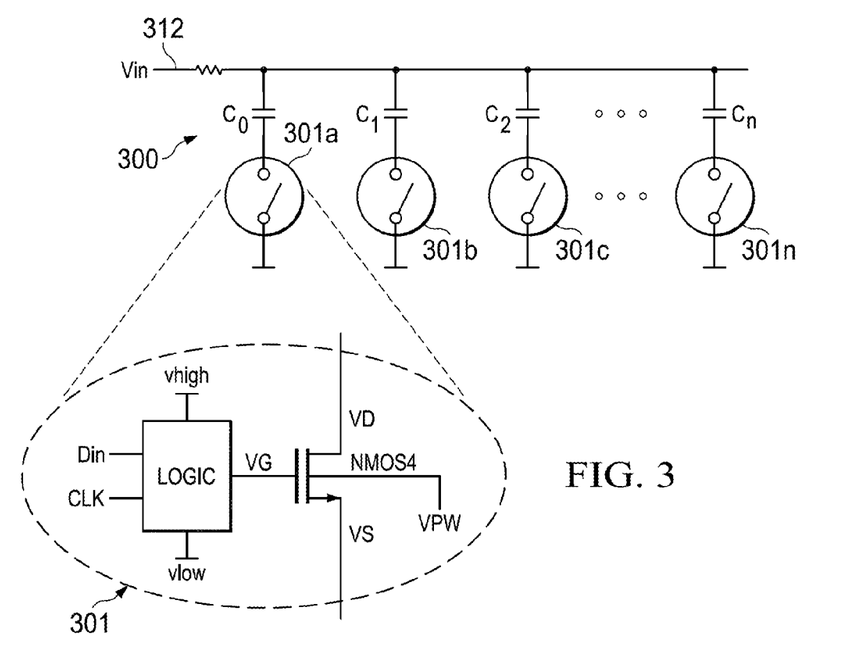
FIG. 3 illustrates the programmable capacitor of FIG. 1A implemented as part of a programmable capacitor array according to another example embodiment of the disclosure.
Figure 4:
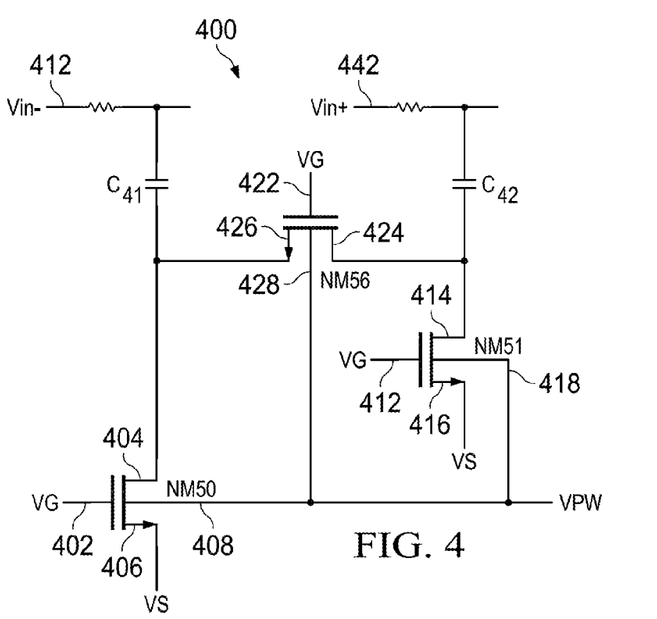
FIG. 4 illustrates the programmable capacitor of FIG. 1A implemented in a differential system according to a further example embodiment of the disclosure.

Referring now to FIG. 3, therein are illustrated multiple capacitors in a programmable array utilizing the embodiment of FIG. 1A, according to another example embodiment of the disclosure. The embodiment of programmable capacitor 100 of FIG. 1A could be used to create an array of programmable capacitors 300 as shown in FIG. 3. In FIG. 3, each individual structure, 301a, 301b, 301c . . . 301n, which may be implemented similarly to FIG. 1A, and coupled to capacitors C0, C1, C2 . . . Cn, respectively, provides the advantages of the embodiments. Further, the embodiments of FIG. 1A could be used as part of a differential system 400 as shown in FIG. 4 which comprises transistors NM50, NM51, and NM56, and capacitors C41 and C42. In the embodiment, NM50 has a drain 404 coupled to C41, a source 406 coupled to a node at potential VS, a gate 402 coupled to a node at potential VG, and a backgate 408 coupled to a node at potential VPW. NM51 has a drain 414 coupled to C42, a source 416 coupled to a node at potential VS, a gate 412 coupled to a node at potential VG, and a backgate 418 coupled to a node at potential VPW. NM56 has a drain 424 coupled to C42, a source 426 coupled C41, a gate 422 coupled to a node at potential VG, and a backgate 428 coupled to a node at potential VPW. C41 is coupled to input 412 that receives input signal Vin- and C42 is coupled to input 442 that receives input signal Vin+. In FIG. 4, a control logic outputting a control signal that provides the voltage VG on the gates of NM50, NM51, and NM56, may be implemented and controlled similarly, for example, as the voltage VG was described for NMOS1 of FIG. 1A. The embodiment of FIG. 4 may also be combined with the embodiment shown in FIG. 3 to create an array of programmable capacitors in a differential system having reduced linearity degradation.

Figure 5A:
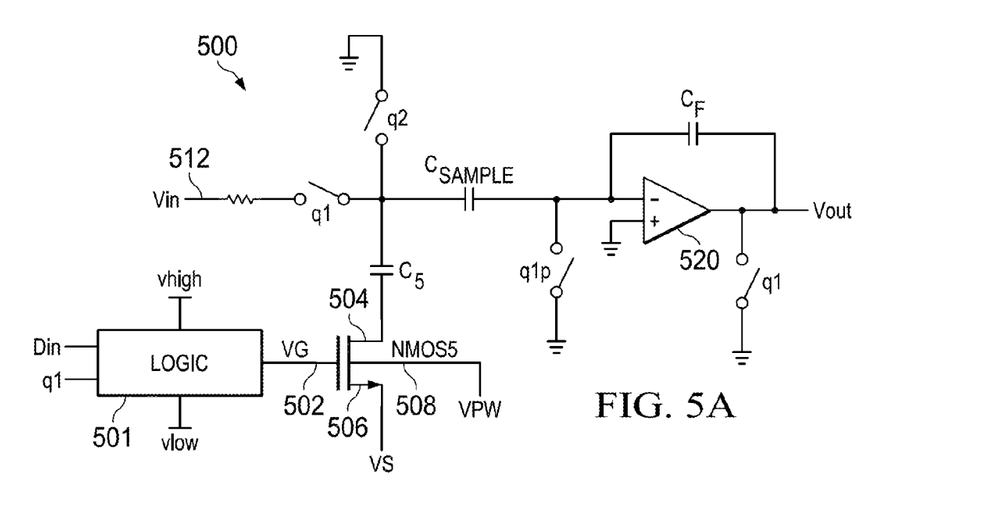
FIG. 5A illustrates the programmable capacitor of FIG. 1A implemented in a switched capacitor sample-and-hold circuitry according to a further example embodiment of the disclosure.
Figure 5B:
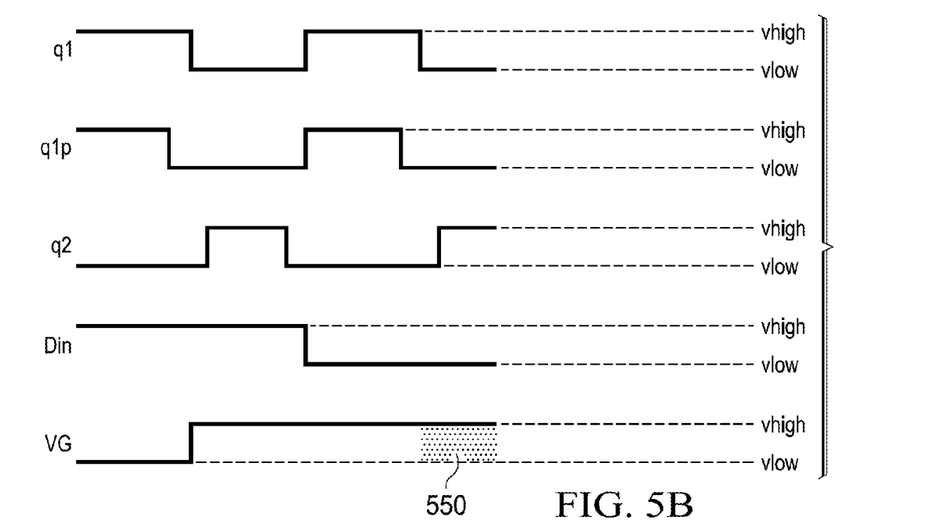
FIG. 5B illustrates example signal waveforms for the example embodiment of FIG. 5A.

Referring now to FIG. 5A, therein is illustrated the programmable capacitor of FIG. 1A implemented within a switched-capacitor sample-and-hold circuitry according to a further example embodiment of the disclosure. Sample-and-hold system 500 is similar to the embodiment of FIG. 1A, with the addition of opamp 520, switches each labelled with their controlling input signal of q1p, q1, and q2, and capacitors CF and CSAMPLE. The remainder of the components of sample-and-hold system 500 may be shown implemented similar to the embodiment of FIG. 1A, with the exception that logic 110 is represented by logic 501 and reference numerals 100-112 are replace by reference numerals 500-512. Sample-and-hold system 500 is shown single ended for simplicity, but could be implemented in an alternative embodiment as a differential system. Also, the programmable capacitor C5 could be implemented in an alternative embodiment as an array of programmable capacitors, C0 . . . Cn. FIG. 5B shows example input waveforms for the embodiment of FIG. 5A and the resulting control signal providing VG on the gate of NMOSS.

Figure 6A:
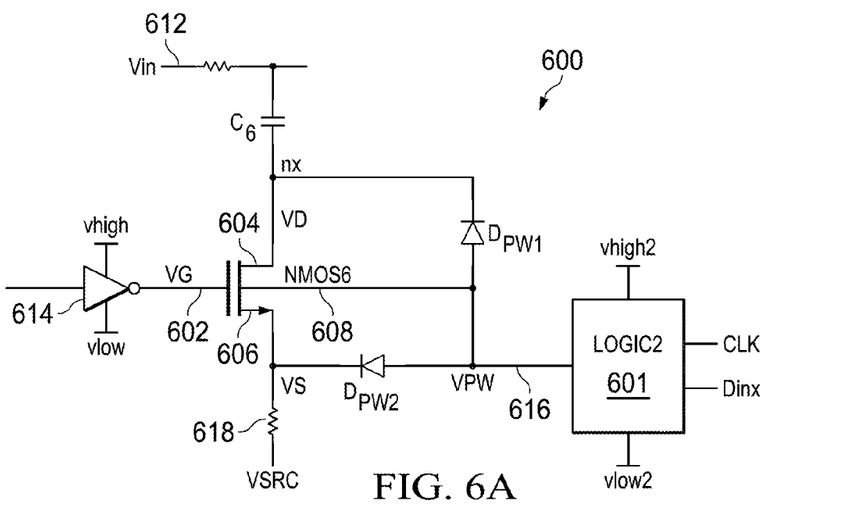
FIG. 6A illustrates a programmable capacitor according to a still further example embodiment of this disclosure.
Figure 6B:
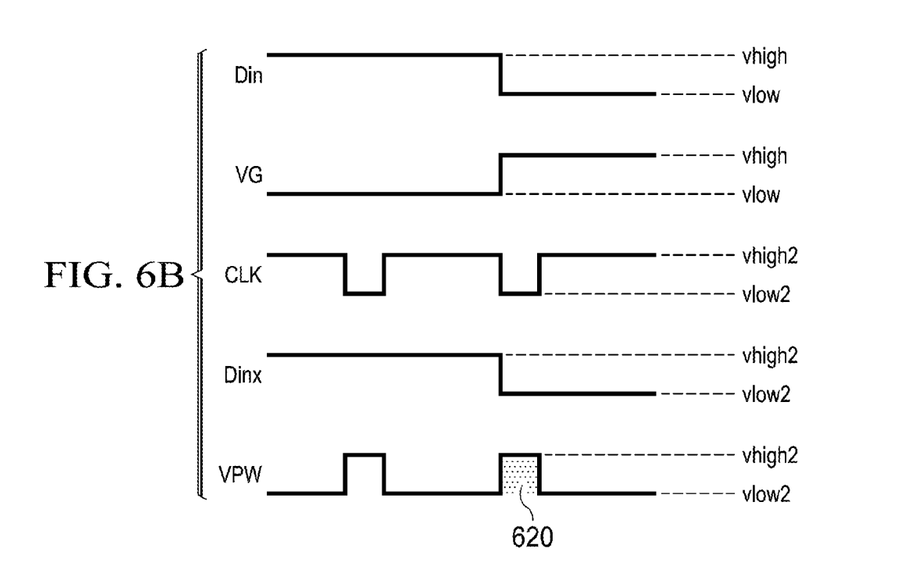
FIG. 6B illustrates signal waveforms for the example embodiment of FIG. 6A.

Referring again to FIG. 5A, when q1 and q1p are high, the input Vin is tracked by the capacitor CSAMPLE. During this tracking period the programmable capacitor C5 may be configured to either load the input Vin (i.e. NMOSS is on and Din is low) or not load the input Vin (i.e. NMOSS is off and Din is high). When q1p goes low the sample is taken on capacitor CSAMPLE by freezing the charge across it. Within a predetermined time after q1p goes low, q1 also goes low disconnecting C5 and CSAMPLE from Vin. During this time period when q1 is low the state of C5 does not affect Vin and this time period ("down time") may be used to charge the drain of NMOSS, node 504, to VS. As shown in logic waveforms of FIG. 5B, the logic 501 in FIG. 5A causes VG to be low when Din is high and q1 is high, however, when q1 goes low, even if Din is high, VG is forced high allowing 504 to charge to VS during this "down time" of q1 being low. In the sample-and-hold operation, when q2 goes high the charge on CSAMPLE is transferred onto the feedback capacitor CF for further processing with the help of the operational amplifier (op amp) 520. Note that when Din is low and the goal is to load the input Vin with C5 by turning on NMOSS, since there is no linearity degradation concern like the case when NMOSS is off and C5 is floating, the VG signal can remain high as shown in FIG. 5B. The shaded region 550 in the waveform of VG in FIG. 5B represents a "do not care" region where VG can be low or high without affecting system performance The example embodiments of FIGS. 1A-5A include logic circuitry implemented to control the gate voltage VG of an MOSFET switch using the CLK and Din signals to short VD to VS during the period of time when clk is low (which is considered a period of "down time") even when Din is high. This ensures that nx (or VD) is set to an appropriate voltage, which is approximately equal to VS, when VG is low. Referring now to FIG. 6A, therein is illustrated a programmable capacitor according to a still further example embodiment of this disclosure. The circuit of FIG. 6A comprises transistor NMOS6, capacitor C6 (of value C), and control circuitry comprising logic2 601. The capacitor C6 couples node nx to the input 612 which receives input signal Vin. NMOS6 has a drain terminal 604 that is coupled to node nx and is at voltage potential VD. NMOS6 also has a source terminal 606 that is coupled to a voltage potential VS set by voltage VSRC, a gate terminal 602 at a voltage potential VG and a backgate terminal 608 at a voltage potential VPW. Logic2 601 provides a control signal at a high (vhigh2) or low (vlow2) logic level to provide the voltage VPW at the backgate 608 of NMSO6. Diodes DPW1 and DPW2 represent the p-well or p-substrate internal diodes of NMOS6. In the embodiment of FIG. 6A, VD is set by using the internal DPW1 diode that exists between the NMOS6 backgate 608 (i.e. p-well node) and the NMOS6 drain 604 which is at VD. In FIG. 6A, the gate 602 of NMOS6 is driven by the signal Din through input circuitry comprising inverter 614 which provides VG and controls whether nx is left floating (when Din is high) or tied to VSRC (when Din is low). The VPW signal may be created using logic2 circuitry 601 and output on the backgate 608 of NMOS6. Logic2 601 is controlled by two inputs, CLK and Dinx. Dinx is identical to Din, but with high and low voltage levels set by vhigh2 and vlow2 respectively. vlow2 is selected so that the diodes $DPW_1$ and $DPW_2$ are off (i.e. reverse biased) when VPW=vlow2, and vhigh2 is selected so that the diode $DPW_1$ turns on and pulls nx up sufficiently to "vhigh2-$V_{ON\_DPW}$" when VPW=vhigh2. Here, $V_{ON\_DPW}$ is the approximate diode turn-on voltage which is generally around 0.7V but varies with device processing. When Din and Dinx are low it is not important to pulse VPW high, and VPW can remain low since the NMOS transistor is on in this case and the potential of node nx will approximately be equal to VSRC. This observation is indicated in the timing waveforms shown in FIG. 6B in the form of a "do not care" dotted box 620 on the VPW waveform when Din and Dinx are low.

One alternative embodiment for logic2 circuitry 601 may use an inverted version of clk (i.e. clkB) as an input. In this implementation there would be no need to use Dinx as an input to logic2 circuitry 601. Another possible alternative embodiment for logic2 601 that makes use of the fact that VPW can remain low when Din and Dinx are low to save power would be an implementation of the logic "Dinx AND NOT(CLK)"="Dinx AND CLKB" or any other equivalent combinatorial logic to generate VG. Note that the circuitry shown in FIG. 6A can be implemented with either NMOS devices such as NMOS6 in a p-well or on PMOS devices in an n-well. Also, in FIG. 6A, vhigh, vlow, vhigh2, vlow2 and VSRC are voltage sources, which are typically realized with some form of an on-chip or off-chip voltage reference(s), charge pumps and may be a voltage buffer or any other type of voltage source. There are multiple alternative ways to implement circuitry to generate vhigh, vlow, vhigh2, vlow2 and VSRC. The resistor 618 of FIG. 6A between VSRC and the NMOS6 source 606 is an optional current limiting component that will limit the current through $DPW_2$ when VPW is equal to vhigh2.

In the discussions of the embodiments above, the switches and transistors are deemed to be ON when the control signal is high, and OFF when the control signal is low, as would be the case for an NMOS transistor, for example. However, it should be noted that the use of complementary switches and complementary drive levels is an equally viable option for implementing the switches. That is, PMOS transistors could replace NMOS transistors with a complementary gate drive circuit, and both NMOS and PMOS transistors can be used in parallel using both polarities of a control signal.

In one example embodiment, any number of electrical circuits of the FIGURES may be implemented on a motherboard or integrated circuit of an associated electronic device. The integrated circuit could be for any type of application. The motherboard can be a general circuit board that can hold various components of the internal electronic system of the electronic device and, further, provide connectors for other peripherals. More specifically, the motherboard can provide the electrical connections by which the other components of the system can communicate electrically. Any suitable processors (inclusive of digital signal processors, microprocessors, supporting chipsets, etc.), memory elements, etc. can be suitably coupled to the motherboard based on particular configuration needs, processing demands, computer designs, etc. Other components such as external storage, additional sensors, controllers for audio/video display, and peripheral devices may be attached to the motherboard as plug-in cards, via cables, or integrated into the motherboard itself.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

In certain contexts, the features and embodiments discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used in image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smart phones, tablets, security systems, PCs, gaming technologies, virtual reality, simulation training, etc.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A low distortion programmable capacitor for reducing linearity degradation on an input signal, comprising:
   a Vin input for receiving a Vin signal;
   a capacitor coupled between the Vin input and a first node;
   a transistor having a gate and a drain coupled to the first node, the transistor configured to turn on to load the Vin input with the capacitor and turn off to remove the load of the capacitor from the Vin input in response to a VG signal on the gate; and
   control circuitry that has a Din input and a clock input, the control circuitry configured to provide the VG signal to turn on the transistor when the Din input is in a first state, and, when the Din input is in a second state, to provide the VG signal to switch the transistor on and off in response to a signal on the clock input to reduce linearity degradation on Vin signal.

2. The low distortion programmable capacitor of claim 1, wherein the capacitor comprises a first capacitor, the transistor comprises a first transistor, and the low distortion programmable capacitor further comprises:
   one or more second capacitors, each having a first and second terminal, the first terminal coupled to the Vin input; and
   one or more second transistors, each having a drain coupled to the second terminal of one of the one or more second capacitors, and a gate coupled to the control circuitry to receive the VG signal.

3. The low distortion programmable capacitor of claim 1, wherein the capacitor includes a terminal coupled to the input through a first switch.

4. The low distortion programmable capacitor of claim 3 further comprising a sample and hold circuit coupled to a terminal of the capacitor, wherein capacitor comprises a first capacitor and the sample and hold circuit comprises:
   an opamp having a plus input coupled to ground potential, a minus input, and an output;
   a second capacitor coupled between the terminal of the first capacitor and the minus input of the opamp:
   a third capacitor coupled between the minus input and the output of the opamp; and
   second, third and fourth switches coupling, respectively, the terminal of the first capacitor, the minus input of the opamp and the output of the opamp to ground potential.

5. The low distortion programmable capacitor of claim 4, wherein:
   the transistor has a source coupled to a second node at a voltage VS, a backgate terminal coupled to a third node at a voltage VPW, and an internal PN diode between the first and third nodes; and
   the voltage levels of VS, VPW and VG are selected so that when the VG signal turns the transistor off, the transistor and the internal parasitic PN diode of the transistor remain off throughout a range of voltage values and slew rates of Vin.

6. The low distortion programmable capacitor of claim 1, wherein the capacitor comprises a first capacitor and the transistor comprises a first transistor, the programmable capacitor having a differential system comprising:
   a Vin minus input for receiving a Vin minus signal;
   a second capacitor coupled between the Vin minus input and a fourth node; and
   a second transistor having a drain coupled to the fourth node, and a gate coupled to the control circuitry to receive the VG signal.

7. The low distortion programmable capacitor of claim 6, further comprising a third transistor having a drain coupled to the first node, and a gate coupled to the control circuitry to receive the VG signal.

8. The low distortion programmable capacitor of claim 7, wherein the first and second capacitors are coupled to the Vin input and Vin minus input through a first and second switch, respectively.

9. The low distortion programmable capacitor of claim 8, further comprising a differential implementation of a sample and hold circuit coupled to the first and second capacitors.

10. A method for operating a low distortion programmable capacitor for reducing linearity degradation on an input, comprising:
    receiving a Vin signal at the input, wherein the input is coupled to the drain of a transistor through a capacitor;
    turning on the transistor and load the capacitor on the input in response to a Din signal being in a first state; and
    turning the transistor on and off in response to a clock signal when the Din signal is in the second state to reduce the linearity degradation on the Vin signal.

11. The method of claim 10, wherein the input comprises a first input, the transistor comprises a first transistor the capacitor comprises a first capacitor, and the receiving comprises receiving a Vin plus signal at the first input, the method further comprising:
    receiving a Vin minus signal at a second input, wherein the second input is coupled to the drain of a second transistor through a second capacitor;
    turning on the second transistor and load the second capacitor on the second input in response to the Din signal being in a first state; and
    turning the second transistor on and off in response to the clock signal when the Din signal is in the second state to reduce the linearity degradation on the Vin minus input.

12. The method of claim 10, further comprising providing a VG signal to a gate of the transistor, a voltage VS to a source of the transisto, and a voltage VPW to a backgate of the transistor, wherein the voltage levels on VS, VPW and VG are selected so that when the VG signal turns the transistor off, the transistor and an internal parasitic PN diode of the transistor between the backgate and drain of the transistor remain off throughout a selected range of voltage values and slew rates of the Vin signal.

13. The method of claim 10, further comprising:
    providing a sample and hold circuit coupled to the terminal of the capacitor for providing a sampled and held output signal Vout; and
    using the low distortion programmable capacitor to alter the input loading and tracking bandwidth of the sample and hold circuit.

14. The method of claim 10, wherein the transistor comprises a first transistor, the capacitor comprises a first capacitor, and wherein the method further comprises:

providing at least one second transistor having a drain coupled to the input through a second capacitor, and operating each of the first transistor and each of the at least one second transistor according to the operations for the transistor of claim 10 to provide a programmable capacitor array.

15. The method of claim 14, further comprising providing a sample and hold circuit coupled to the terminals of the first and at least second capacitors for providing a sampled and held output signal Vout.

16. The method of claim 15, further comprising using the programmable capacitor array to alter the input loading and tracking bandwidth of the sample and hold circuit.

17. The method of claim 11, further comprising:

providing a VG signal to a gate of the second transistor, the voltage VS to a source of the second transistor, and the voltage VPW to a backgate of the second transistor, wherein the voltage levels on VS, VPW and VG are selected so that when the VG signal turns the second transistor off, the second transistor and an internal parasitic PN diode of the second transistor between the backgate and drain of the second transistor remain off throughout a selected range of voltage values and slew rates of the Vin minus signal.

18. An integrated circuit for reducing linearity degradation on an input, comprising:

a transistor having a drain coupled to the input through a capacitor;

means for turning on a transistor to load the capacitor on the input in response to a Din signal being in a first state;

means for turning on and off the transistor in response to a clock signal when the Din signal is in a second state to reduce the linearity degradation on the input.

19. The integrated circuit of claim 18, wherein the means for turning on and off the transistor comprises means for turning on the transistor periodically or non-periodically when loading of the capacitor on the input is tolerable for the integrated circuit.

20. The integrated circuit of claim 18, wherein the means for turning on and off the transistor comprises:

means for receiving the Din signal and the clock signal; and means for outputting a control signal to a gate of the transistor, in response to the Din signal and the clock signal, to charge a drain voltage of the transistor to a source voltage of the transistor.

21. The integrated circuit of claim 18, wherein the means for turning on and off the transistor comprises means for preventing turn-on of the transistor over a selected range of voltage values and slew rates of the input signal.

* * * * *